United States Patent
Yeh et al.

(10) Patent No.: US 7,383,484 B2
(45) Date of Patent: *Jun. 3, 2008

(54) CYCLIC REDUNDANCY CHECK BASED MESSAGE PASSING IN TURBO PRODUCT CODE DECODING

(75) Inventors: Nan-Hsiung Yeh, Foster City, CA (US); Yan Li, Tucson, AZ (US)

(73) Assignee: Seagate Technology LLC, Scotts Valley, CA (US)

( * ) Notice: Subject to any disclaimer, the term of this patent is extended or adjusted under 35 U.S.C. 154(b) by 685 days.

This patent is subject to a terminal disclaimer.

(21) Appl. No.: 10/799,231

(22) Filed: Mar. 12, 2004

(65) Prior Publication Data

US 2005/0204255 A1 Sep. 15, 2005

(51) Int. Cl.
*H03M 13/00* (2006.01)
(52) U.S. Cl. .................................... 714/780; 714/758
(58) Field of Classification Search ................ 714/758, 714/755, 780
See application file for complete search history.

(56) References Cited

U.S. PATENT DOCUMENTS

| 5,859,859 | A | 1/1999 | Kim |
| 6,223,319 | B1 | 4/2001 | Anderson |
| 6,526,538 | B1 | 2/2003 | Hewitt |
| 6,591,390 | B1 * | 7/2003 | Yagyu .......................... 714/755 |
| 6,606,725 | B1 | 8/2003 | Wang |
| 6,950,977 | B2 * | 9/2005 | Lavi et al. ................... 714/758 |
| 2002/0026615 | A1 * | 2/2002 | Hewitt et al. ............... 714/752 |
| 2003/0053493 | A1 * | 3/2003 | Mobley et al. ............. 370/538 |
| 2003/0106012 | A1 | 6/2003 | Hewitt |

FOREIGN PATENT DOCUMENTS

| WO | WO00/19616 | 4/2000 |
| WO | WO03/005591 A1 | 1/2003 |

* cited by examiner

*Primary Examiner*—M. Mujtaba K Chaudry
(74) *Attorney, Agent, or Firm*—Cesari and McKenna, LLP

(57) ABSTRACT

A method of decoding a turbo product code (TPC) code word comprises performing a cyclic redundancy check (CRC) on each of a plurality of code blocks of the TPC code word. The bits of code blocks of the TPC code word which pass the CRC are assigned an artificially high probability confidence measure, such as an artificially high log-likelihood ratio. Assigning these bits an artificially high probability confidence measure allows an iterative process, between a soft decision algorithm and a TPC decoder, to be less complex and to converge on a correct decoding solution more quickly. Apparatus for implementing the method are also provided.

18 Claims, 10 Drawing Sheets

Definite "1"

Definite "0"

Trellis with the second column to have a definite value

Normal trellis

US 7,383,484 B2

CYCLIC REDUNDANCY CHECK BASED MESSAGE PASSING IN TURBO PRODUCT CODE DECODING

FIELD OF THE INVENTION

The present invention relates to Turbo Product Code (TPC). More particularly, the present invention relates to TPC decoding techniques.

BACKGROUND OF THE INVENTION

Turbo code using iterative decoding algorithms has been shown to give a significant performance advantage over existing partial response maximum likelihood (PRML) channels. Turbo Product Code (TPC) with single parity check (TPC/SPC), which belongs to a family of turbo codes, presents the potential for less complex implementations with minimal performance losses. See for example J. Li, K. R. Narayanan, E. Kurtas, and C. N. Georghiades, "On the Performance of High-Rate TPC/SPC Codes and LDPC codes over Partial Response Channels", *IEEE Trans. Commun.*, Vol. 50, pages 723-734, May 2002. TPC generally utilizes "square" code words (i.e., code words having the same number of rows and columns of bits), with each code word being comprised of square code blocks. An example of a 512 byte (4,096 bit) TPC code word is a code word having four 32 bits by 32 bits code blocks.

When using a TPC (such as a TPC/SPC) to encode data for transmission or storage, it is common to utilize a soft decision algorithm in conjunction with the TPC decoder to iteratively decode the data. Examples of soft decision algorithms include Soft Output Viterbi Algorithms (SOVAs) and Bahl, Cocke, Jelinek, and Raviv (BCJR) algorithms. As the decoding process advances, message data is passed iteratively between the soft decision algorithm and the TPC decoder. The message data can include, for example, all of the code blocks of the code word being decoded, along with probability data and the like. When using soft decision algorithms such as a SOVA, the probability data typically takes the form of log-likelihood values for the various bits of the code word. With each additional iteration, the error rate is typically improved. However, increased iterations come at the expense of increased power dissipation, hardware complexity and data latency.

Embodiments of the present invention provide solutions to these and/or other problems, and offer other advantages over the prior art.

SUMMARY OF THE INVENTION

A method of decoding a turbo product code (TPC) code word comprises performing a cyclic redundancy check (CRC) on each of a plurality of code blocks of the TPC code word. The bits of code blocks of the TPC code word which pass the CRC are assigned an artificially high probability confidence measure, such as an artificially high log-likelihood ratio. Assigning these bits an artificially high probability confidence measure allows an iterative process, between a soft decision algorithm and a TPC decoder, to be less complex and to converge on a correct decoding solution more quickly. Apparatus for implementing the method are also provided.

In some embodiments, iteratively decoding the TPC code word comprises iteratively decoding the TPC code word using a soft decision algorithm such as a soft output viterbi algorithm (SOVA) or a Bahl, Cocke, Jelinek, and Raviv (BCJR) algorithm and a TPC decoder. Also, in some embodiments, the TPC code word is a single parity check TPC code word (TPC/SPC).

In some embodiments, the step of performing the CRC on each of the plurality of code blocks further comprises performing the CRC on each of the plurality of code blocks during a first iteration between the soft decision algorithm and the TPC decoder. Performing the CRC on each of the plurality of code blocks during the first iteration between the soft decision algorithm and the TPC decoder can further comprise performing the CRC on each of the code blocks after decoding using the TPC decoder and before the corresponding probability confidence measures represented by the extrinsic information from the plurality of code blocks are sent back to the soft decision algorithm.

In some embodiments, performing the CRC on each of the plurality of code blocks further comprises performing the CRC on each of the plurality of code blocks during each of a plurality of iterations between the soft decision algorithm and the TPC decoder. In these embodiments, assigning the artificially high probability confidence measure to bits of any of the plurality of code blocks which pass the CRC further comprises assigning the artificially high probability confidence measure to bits of each code block which passes the CRC during the iteration in which the code block passes the CRC.

Other features and benefits that characterize embodiments of the present invention will be apparent upon reading the following detailed description and review of the associated drawings.

BRIEF DESCRIPTION OF THE DRAWINGS

FIG. 8-1 is a block diagram illustrating a code block TPC/SPC decoder apparatus in accordance with the present invention.

FIG. 8-2 is a state diagram illustrating operation of the finite state machine shown in FIG. 8-1.

DETAILED DESCRIPTION OF ILLUSTRATIVE EMBODIMENTS

Figure 1:
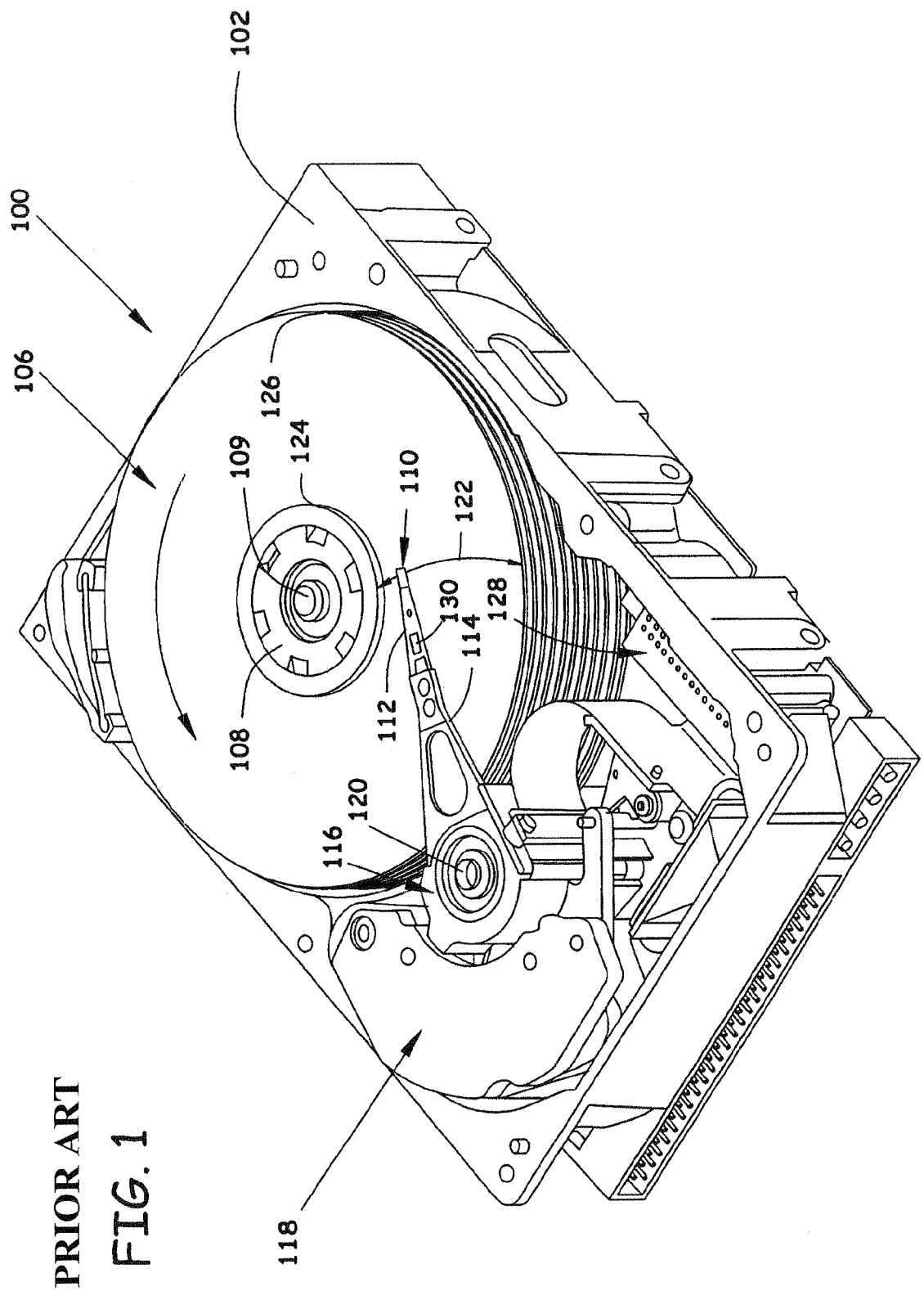
FIG. 1 is an isometric view of a disc drive.

Referring to FIG. 1, a perspective view of a disc drive 100 is shown. The present invention is useful in iteratively decoding turbo product code (TPC) code words in disc drive 100. In accordance with an aspect of the present invention, a Cyclic Redundancy Check (CRC) is performed on each of the plurality of code blocks of a TPC code word. For any code blocks which pass the CRC, the corresponding bits are assigned an artificially large log-likelihood ratio or other probability confidence measure. The processing requirements associated with decoding these bits are then reduced or eliminated in subsequent iterations. The number of iterations can also be reduced by aiding the iterative decoder in converging to the correct solution more quickly using the knowledge of correct bits in the code blocks (having the artificially large log-likelihood ratios). While embodiments of the present invention are illustrated, for example, with reference to disc drive 100, the present invention is not limited to use with a disc drive data storage system.

Disc drive 100 includes a housing with a base 102 and a top cover (not shown). Disc drive 100 further includes a disc pack 106, which is mounted on a spindle motor (not shown), by a disc clamp 108. Disc pack 106 includes a plurality of individual discs, which are mounted for co-rotation about central axis 109. Each disc surface has an associated disc head slider 110 which is mounted to disc drive 100 for communication with the disc surface. Sliders 110 support MR heads for reading data from the disc surface. The MR heads include MR readers or sensors, or in the alternative, the MR heads can be considered to be the MR readers.

In the example shown in FIG. 1, sliders 110 are supported by suspensions 112 which are in turn attached to track accessing arms 114 of an actuator 116. The actuator shown in FIG. 1 is of the type known as a rotary moving coil actuator and includes a VCM, shown generally at 118. VCM 118 rotates actuator 116 with its attached head 110 about a pivot shaft 120 to position head 110 over a desired data track along an arcuate path 122 between a disc inner diameter 124 and a disc outer diameter 126. VCM 118 is driven by servo electronics (diagrammatically included within electronics 128) based on signals generated by heads 110 and a host computer (not shown). A micro-actuator 130, which provides fine position control of heads 110, is used in combination with VCM 118 that provides relatively coarse positioning of heads 110.

The methods of the present invention are practiced, for example, in channel circuitry (diagrammatically included within electronics 128) of disc drive 100. As noted previously, while disc drive 100 is shown in FIG. 1 for illustrative purposes, the present invention is not limited to use with disc drive data storage systems. Instead, the present invention applies to other types of data storage systems which utilize TPC, to communication systems which utilize TPC, to other apparatus or systems which utilize TPC, and to methods and apparatus for decoding TPC. The apparatus shown in FIG. 1 is also intended to be generically representative of these other embodiments as well.

Figure 2:
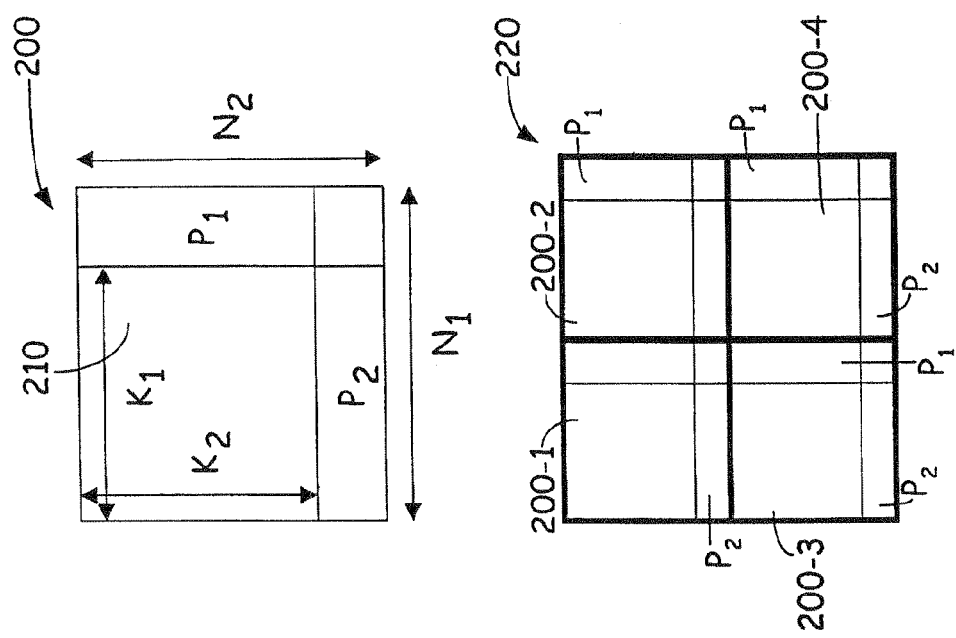
FIG. 2 is a diagrammatic illustration of a Turbo Product Code (TPC) code block and a TPC code word.

FIG. 2 is a diagrammatic illustration of a TPC code word 220 which is comprised of a number of square code blocks 200. As shown in FIG. 2, code word 220 includes four code blocks 200-1 through 200-4, generically represented as code block 200. In this example, each code block 200 includes a user data portion 210 having respective dimensions of $K_1$ bits by $K_2$ bits, where $K_1=K_2$. In one particular example embodiment in which each code word 220 is to contain 512 bytes of user data, $K_1$ and $K_2$ are equal to 32 bits.

Each code block 200 can include $P_1$ columns of parity bits and $P_2$ rows of parity bits. When TPC code word 220 is a two-dimensional turbo product code based on a single parity check (TPC/SPC), then $P_1=P_2=1$, resulting in the overall dimensions of each code block being $N_1=N_2=33$. The resulting code rate in this example is 0.94. The four code blocks 200-1 through 200-4 are concatenated and interleaved to produce one TPC/SPC code word. The code word length is 4,096 user bits (4*32*32=4,096) or 4,356 channel bits (4*33*33=4,356).

The acronym "CRC" defined as being a "Cyclic Redundancy Check" is also frequently used in the art to denote a "Cyclic Redundancy Code." Used in this manner, the "Cyclic Redundancy Check" can be referred to as a "Cyclic Redundancy Code check" or a "CRC check." When adding CRC bits to a TPC (for example a TPC/SPC) code word, any addition of CRC bits has to occur before the insertion of the rows and columns $P_1$ and $P_2$ of parity bits in order to obtain the protection from the TPC. In other words, CRC bits must also be added before the TPC encoding. Further, with the addition of a few CRC bits, the potential exists for the remaining user data space to be less than the dictated user data sector length (for example 512 bytes in typical data storage systems) and the code block length required in the TPC. These same implementation issues also occur with the addition of ECC bits.

Figure 3:
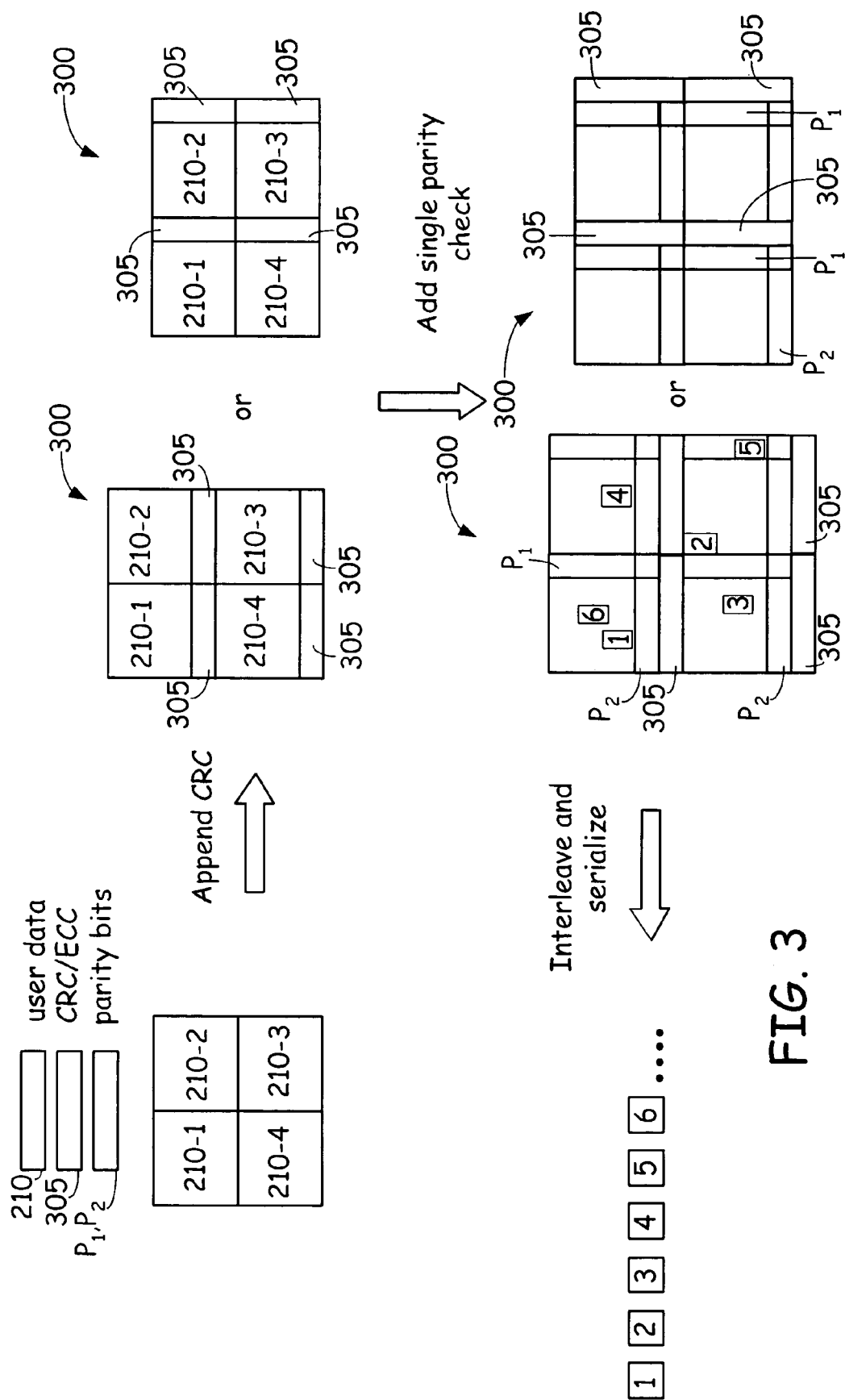
FIG. 3 is a diagrammatic illustration of an encoding scheme for a TPC code word with Cyclic Redundancy Check (CRC) bits added to each of the code blocks.

As seen in FIG. 3, in some embodiments of the present invention, a row or column 305 of CRC/ECC bits is appended to each of the multiple code blocks of code word 300. After appending the CRC/ECC bits 305 to the code blocks, a single column $P_1$ and row $P_2$ of parity bits is added to each of the code blocks. The code word having appended CRC/ECC bits and parity bits added is then interleaved and serialized. It is noteworthy that, using this method, the addition of CRC bits, ECC bits and parity bits did not reduce the original quantity of user data in the code word. However, the present invention is not limited to the particular method of implementing CRC, ECC and parity bit schemes in TPC/SPC code words illustrated in FIG. 3. Instead, the present invention is applicable to TPC code words having CRC bits added, regardless of whether the CRC bits are appended to the existing user data, or whether the CRC bits replace a portion of the user data.

Figure 4:
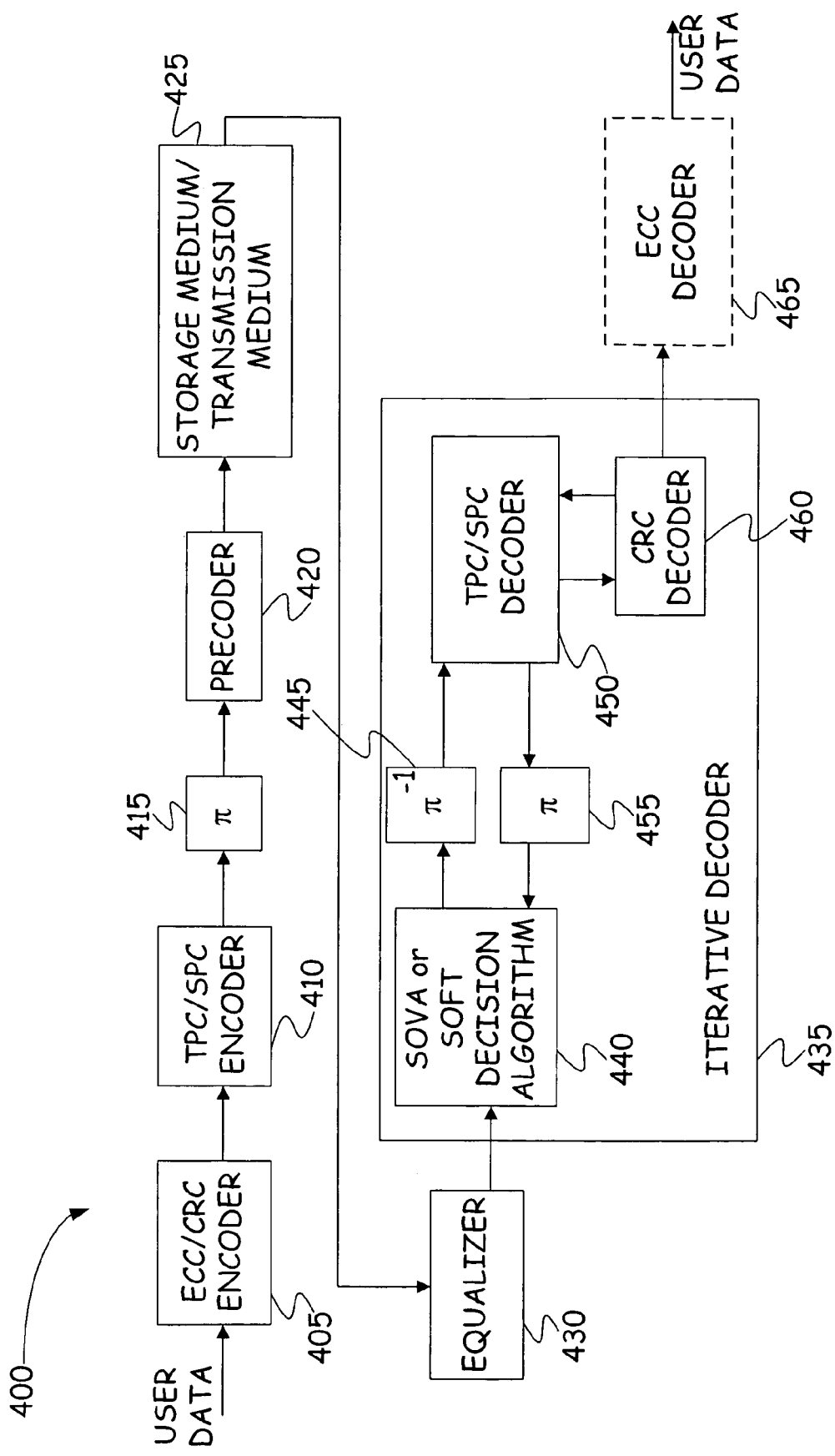
FIG. 4 is a block diagram illustrating a system and method of TPC decoding in accordance with embodiments of the invention.

Referring now to FIG. 4, shown is a system 400 configured to implement iterative decoding methods of the present invention. System 400 can be a channel integrated chip (IC) or other circuitry configured to implement the methods of the present invention. System 400 can be implemented within a data storage system, in a communication system, or in other systems and apparatus, all of which can be considered to be generically represented in FIG. 4.

As shown in FIG. 4, user data is provided to ECC/CRC encoder 405. Encoder 405 adds the ECC and CRC data to the user data prior to encoding using TPC/SPC encoder 410. The combined data and ECC/CRC bits are then encoded into a TPC/SPC format. For example, encoder 410 can place the data and ECC/CRC bits into code word formats such as the one illustrated in FIG. 3. It must be noted that, while encoder 410 is illustrated as being a TPC/SPC encoder, encoder 410 can be any type of TPC encoder, and is not limited to a TPC encoder which implements an SPC.

The TPC/SPC encoded user data and ECC/CRC data bits are then provided to interleaver block or circuitry 415 which scrambles the locations (order) of the bits of the code blocks which make up the code word. The interleaved code word is then provided to precoder 420 which precodes the code word using any of a variety of well-known techniques which aid in avoiding error propagation. The interleaved and precoded bits are then provided to storage medium or transmission medium 425. In embodiments in which the present invention is used in a data storage system, storage medium 425 can be a data storage disc or other storage medium on which the TPC/SPC encoded data is stored. In order to store the encoded data on the storage medium, and in order to retrieve the stored encoded data from the storage medium, block 425 in FIG. 4 also represents a data head or other transducer which aids in this process. In other embodiments, block 425 represents a transmission medium over which the encoded data is transmitted. In these embodiments, block 425 would also represent the corresponding transmitters and receivers to aid in the transmission of the encoded data.

During read back or receipt of the encoded data, an electrical signal indicative of the encoded data is generated and provided to equalizer 430 for conversion to a specific desired spectrum or target shape. In the equalizer circuit or block 430, the signal can be sampled at a baud rate, with the sampled values sent to the soft decision algorithm implementing block or circuitry 440 of iterative decoder 435. In exemplary embodiments, the invention is described with reference to the soft decision algorithm being a Soft Output Viterbi Algorithm (SOVA). However, the present invention is not limited to use with a SOVA, but rather applies to iterative decoding between a soft decision algorithm (such as a SOVA or a BCJR algorithm) and a TPC decoder.

As is well known in the art, SOVA (or soft decision algorithm) 440 is a sequence detector which considers not only the value of a current bit, but also the values of entire sequences of bits. Generally speaking, the SOVA considers which of multiple possible sequences is the maximum likelihood sequence corresponding to a particular encoded bit stream. Thus, the SOVA outputs with (or associates with) each possible sequence a probability of that sequence (and of the particular bits in that sequence) being correct. These probabilities are typically in the form of path metric distances in the Viterbi trellis. This information is provided through de-interleaver 445 to TPC/SPC decoder 450.

TPC/SPC decoder 450 places all of the de-interleaved bits into the code blocks of the code word, using the probabilities of whether each bit of the code blocks are ones or zeros to minimize errors in the decoding process. In a conventional format, the TPC decoder 450 redefines the probability for each of these bits being a one or a zero based on the row and the column parity checks, and passes this extrinsic information (new probability information added on by TPC) back to the SOVA 440 through interleaver circuitry 455 for the SOVA to re-process the data. This process can be repeated a number of times to perform multiple iterations. The more iterations between the TPC decoder and the SOVA (or other soft decision algorithm) which are performed, the lower the resulting error rate in the code word. However, as the number of iterations performed increases using conventional methods, increases in power dissipation, hardware complexity requirements and data latency also result. The present invention improves the efficiency of this iterative process, thereby providing one or more of reduced processing requirements, reduced power consumption, and reduced data latency.

In order to improve the efficiency of the iterative process, in accordance with the invention after each iteration between the SOVA or soft decision algorithm 440 and TPC decoder 450, a cyclic redundancy code check (CRC check) is performed on each of the individual code blocks 210 of the code word 220/300 by CRC decoder 460. CRC decoder 460 then passes the results of the CRC check back to TPC decoder 450. For any bits which have passed the CRC check, TPC decoder 450 re-assigns those bits artificially large log-likelihood values (or other probability confidence measures). In other words, for any code block of the code word which passes the CRC check, the log-likelihood values associated with the bits of that code block are assigned a probability confidence measure indicative of a very high confidence that these bits are correctly decoded.

After re-assigning the log-likelihood values for the bits of code blocks which pass the CRC check, this extrinsic information is passed back to SOVA or soft decision algorithm 440 (via interleaver 455) in additional iterations. It should be understood that references herein made to passing or sending probability confidence measures from the TPC decoder to the SOVA are intended to include the passing of the extrinsic information representative of the probability confidence measures. Since SOVA 440 can readily determine that the bits of the code blocks which passed the CRC check are correct, the SOVA need not change the values of these bits and the SOVA processing steps associated with the bits in these code blocks can be reduced or eliminated in future iterations. Also, having one or more of the code blocks assigned artificially high log-likelihood values allows SOVA 440 to converge more quickly and with less computations in each iteration since it can safely assume that the code blocks assigned artificially high log-likelihood values are correctly decoded. Further, when assigning the artificially high log-likelihood values to code blocks which have passed a CRC, these code blocks can also be waived from additional decoding or parity check computations (typically implemented within decoder 450) in subsequent iterations. This further fine tunes the message passing at the code block level, as opposed to the code word level, to reduce the number of iterations and improve the bit error rate (BER) performance. It is also not necessary to repeat the CRC on code blocks which have passed a CRC in a previous iteration.

After the iterative decoding is terminated, the decoded data can optionally be provided to an ECC decoder 465. ECC decoder 465 is not required in all embodiments because the number of error bits after the iterative decoding process will be minimal if each of the code blocks of the code word pass their respective CRC checks. However, in other embodiments, inclusion of ECC decoder 465 is desirable, particularly if different termination criteria are used. For example, if a predetermined maximum number of iterations is used to terminate the iterative process in the event that the CRC equations are not satisfied, inclusion of ECC decoder 465 to correct remaining errors can still be beneficial. As will be understood, if ECC decoder 465 is not included, then ECC bits need not be added to the code words prior to encoding.

Figure 5:
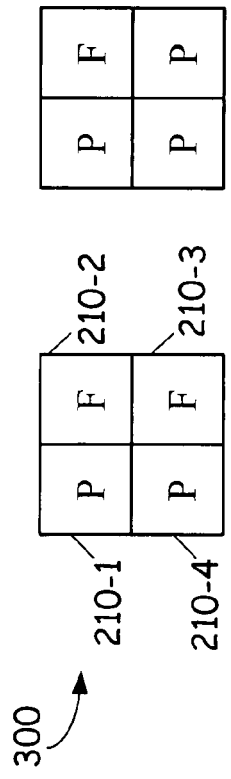
FIG. 5 is a diagrammatic illustration of the reduced processing requirements achieved using the methods of the present invention.
Figure 5:
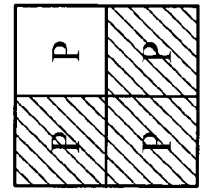
Figure 5:
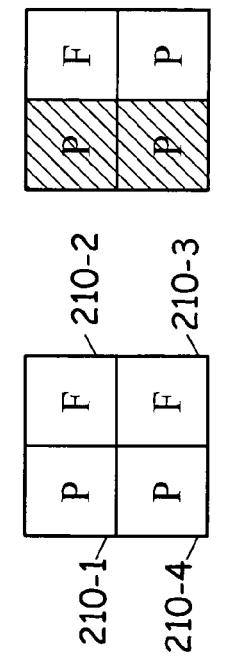

Referring now to FIG. 5, shown is a diagrammatic illustration of the reduced processing requirements achieved using the methods of the present invention. The example illustrated in FIG. 5 assumes that the number of decoding iterations required on a code word 300 is the same regardless of whether or not the code block CRC check method of the present invention is used. Therefore, this example illustrates reduced computation requirements for the same number of iterations when implementing the invention as compared to conventional decoding techniques. As discussed above, in some embodiments the present invention will also result in a reduction in the number of iterations, thereby providing further efficiency benefits.

As shown in FIG. 5, when no code block (also referred to as "sub-block") CRC check is used, each of the four code blocks 210-1 through 210-4 requires computations of posterior message during each of the three iterations, despite the fact that two of the code blocks (210-1 and 210-4) would have passed a CRC check (as denoted with a "P") after the first iteration, and three of the code blocks (210-1, 210-3 and 210-4) would have passed a CRC check after the second iteration. In other words, computations are repeated on code blocks which are already correctly decoded. The computations in a given iteration include, for example, SOVA computations within SOVA implementing circuitry 440, as well as TPC and/or parity check computations within TPC decoder 450.

In contrast, consider the code word iteratively decoded using the code block CRC check of the present invention. As illustrated in FIG. 5, after the first iteration, code blocks 210-1 and 210-4 have passed the CRC check and do not require further computations of posterior messages. Thus, in the second iteration, only code blocks 210-2 and 210-3 require further computations. After the second iteration, code block 210-3 is added to the list of code blocks which do not require further posterior computations. Only code block 210-2 requires further computations during the third iteration. Thus, for a given number of decoding iterations, the processing requirements are reduced, which can in turn result in less power consumption/dissipation and lower hardware complexity. Further, while it is assumed for illustrative purposes that the same number of iterations are required in each of the two examples shown in FIG. 5, this may not be the case. By providing the SOVA with extrinsic information of artificially high log-likelihood values for the bits of code blocks which have passed the CRC check, the number of valid sequences under consideration in the Viterbi trellis can be greatly reduced. The iterative decoding process will typically or frequently be able to more quickly converge on a decoding solution for the entire code word. Thus, using the code block CRC check of the present invention, the number of iterations required to decode a TPC code word can be reduced, thereby providing further benefits.

Figure 6:
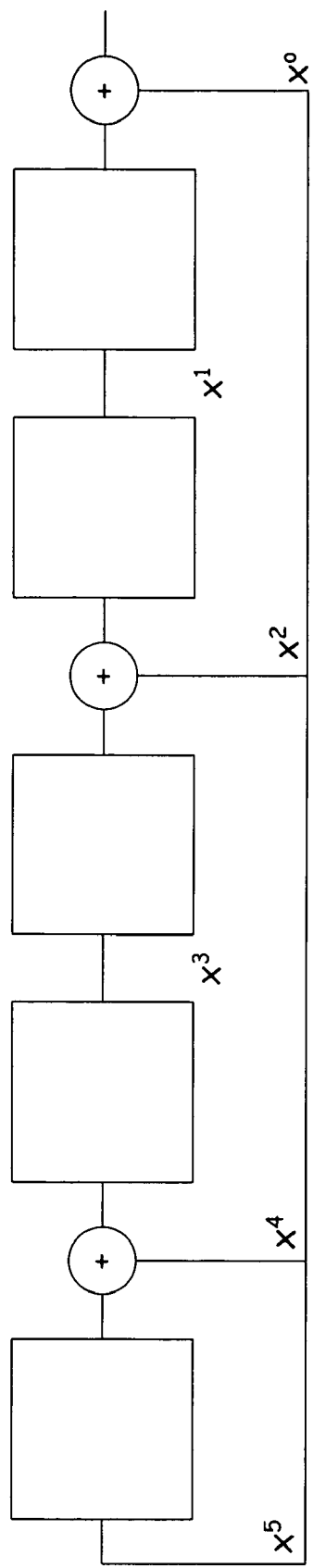
FIG. 6 is a block diagram illustrating circuitry for implementing a CRC code.

FIG. 6 is a block diagram illustrating an example embodiment of CRC decoder 460. In this example embodiment, the code is specified by a polynomial, for example $P(x)=x^5+x^4+x^{2+1}$. The encoding or decoding is implemented using a shift register with feedback as shown in FIG. 6.

In the example shown, when creating the CRC, after input bits of "1010001101", the bits "00000" are appended at the end of the input stream to flush out the content of the register. The content of the register is then "01110". When checking the CRC, the input stream "101000110101110" is fed into the shift register. If the contents of the register after the sequence has passed through the register is then "00000", the CRC equation is satisfied, and the data has been decoded properly.

Figure 7:
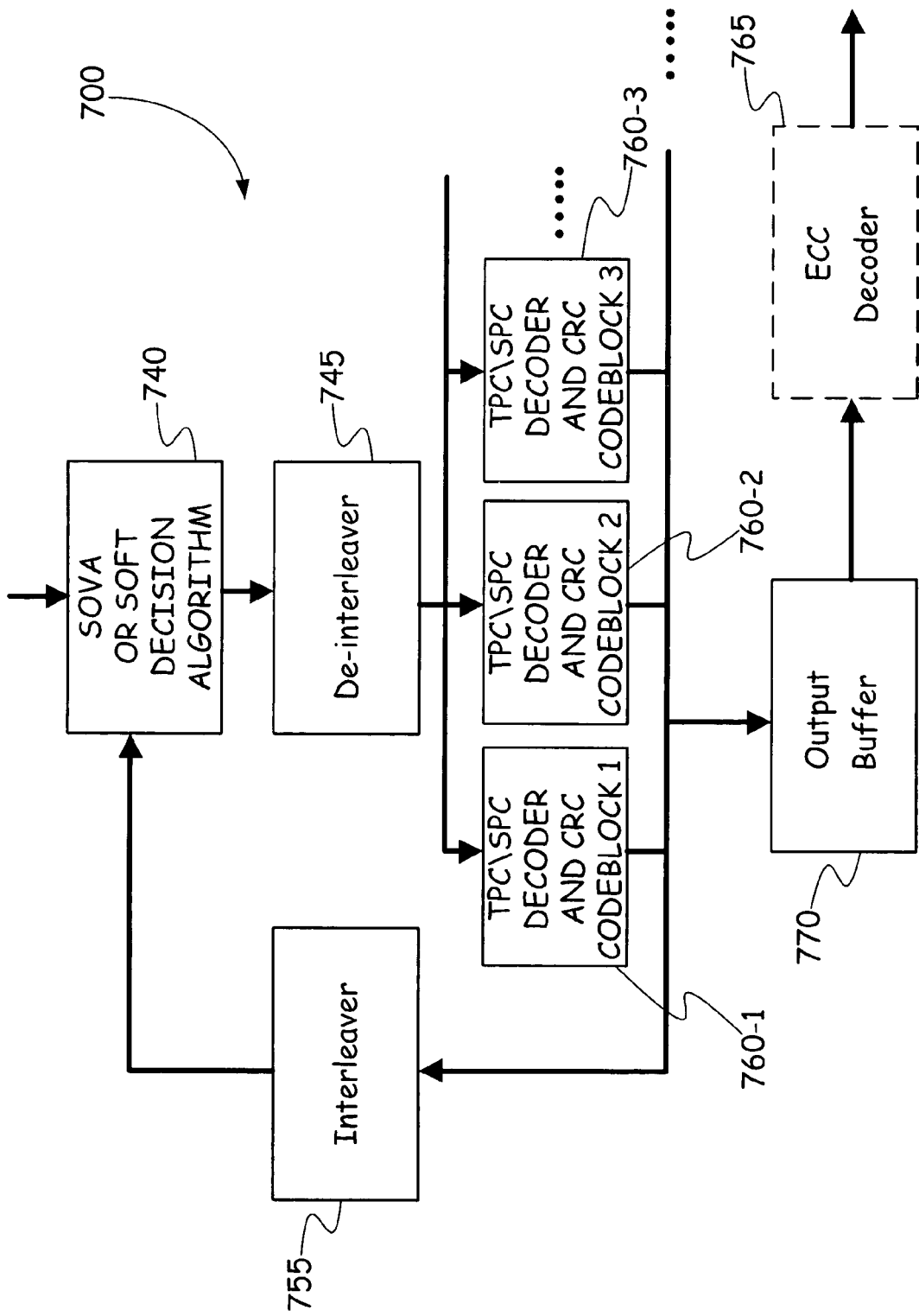
FIG. 7 is a block diagram illustrating the decoding methods and apparatus in accordance with some embodiments of the present invention.

Referring now to FIG. 7, shown in block diagram form is a decoder and method in accordance with some more particular embodiments of the present invention. Decoder 700 is an embodiment of iterative decoder 435 shown in FIG. 4. Decoder 700 includes SOVA or soft decision algorithm 740, de-interleaver 745, TPC/SPC decoding components 760 (components 760-1 through 760-3 are shown), interleaver 755 and output control 770. SOVA 740, de-interleaver 745 and interleaver 755 correspond to components 440, 445 and 455 of iterative decoder 435 shown in FIG. 4. Decoding components 760 each process one code block of the code word, and correspond to the TPC/SPC decoder 450 and CRC decoder 460 shown in FIG. 4. In this example embodiment, there exists one decoding component for each code block of a code word. Therefore, for a code word having four code blocks, decoder 700 includes four decoding components 760. For a code word having a larger number of code blocks, decoder 700 includes the same larger number of decoding components. While the decoding components are illustrated as individual processing modules, it will be understood that these functions can be integrated into fewer processing modules if desired. For example, the decoding components can be integrated into a single decoding component which is suitably programmed or configured to process the individual code blocks.

In operation, SOVA or soft decision algorithm 740 initially processes all code blocks of the code word as discussed above with reference to FIG. 4. The code word and sequence probability data provided by the SOVA are then de-interleaved by de-interleaver 745 and provided to decoding components 760 for processing of individual code blocks. Decoding components 760 each perform the TPC/SPC decoding functions on their respective code blocks of the code word. Each decoding component 760 also performs a CRC on its respective code block. For each code block which passes the CRC, its bits are assigned the artificially large log-likelihood ratios or other probability confidence measures as discussed above.

Figure 9:
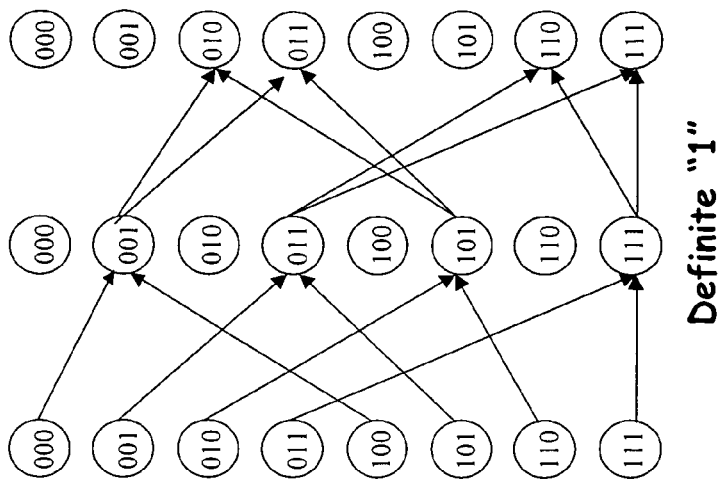
FIG. 9 is an eight-state SOVA trellis diagram indicating how some of the paths can be eliminated based on the pre-determined extrinsic information from the TPC decoder.
Figure 9:
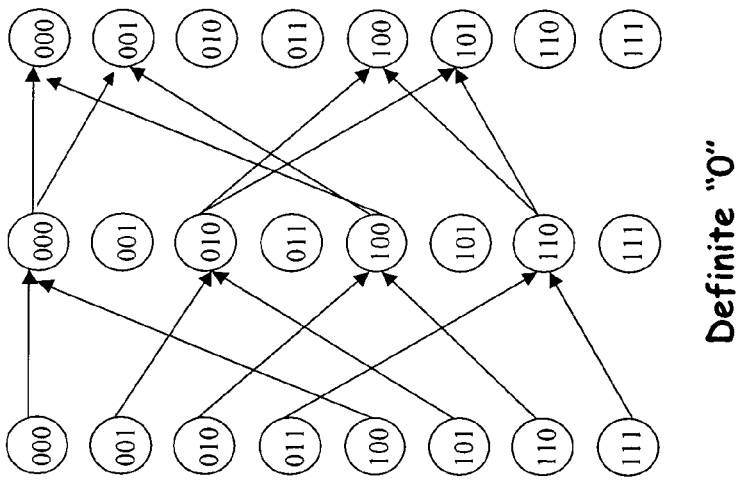
Figure 9:
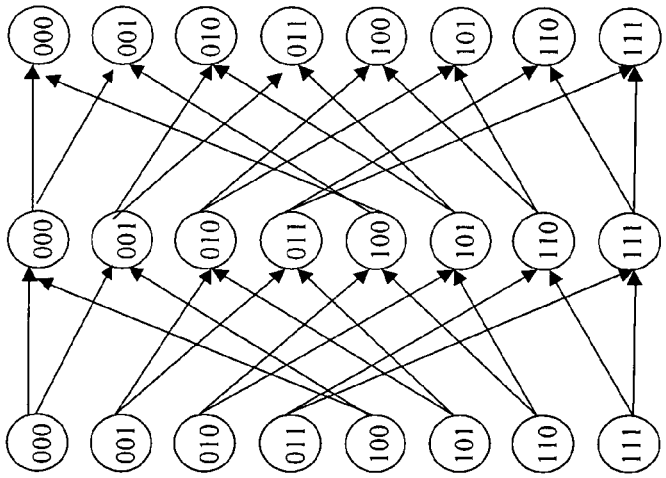

After setting the probability confidence measures for the bits of the code words which pass the CRC check, the extrinsic information is passed back to the soft decision algorithm via interleaver 755 for a subsequent iteration. With the bits of some code blocks assigned the artificially high log-likelihood ratios, the processing implemented by SOVA 740 can be reduced significantly. FIG. 9 is an example of an eight-state Viterbi trellis diagram showing how some of the paths can be eliminated during the SOVA processing if the information of a definite "1" or a definite "0" is pre-assigned to a bit. The number of paths between columns of each trellis is representative of the computations required in an iteration. As can be seen, when a definite value is obtained after a first iteration, the number of paths is reduced, thereby representing the reduced computational requirements.

Referring back to FIG. 7, this iterative process repeats until all of the code blocks pass the CRC or until some other iteration termination criteria causes the iterative decoding process to terminate. Output buffer 770 then provides the decoded code word to the appropriate components or systems. As discussed above, in some embodiments, output buffer 770 provides the decoded code word or code blocks to FCC decoder 765 for ECC decoding, while in other embodiments, ECC decoding is not necessary.

Figures 1, 8:
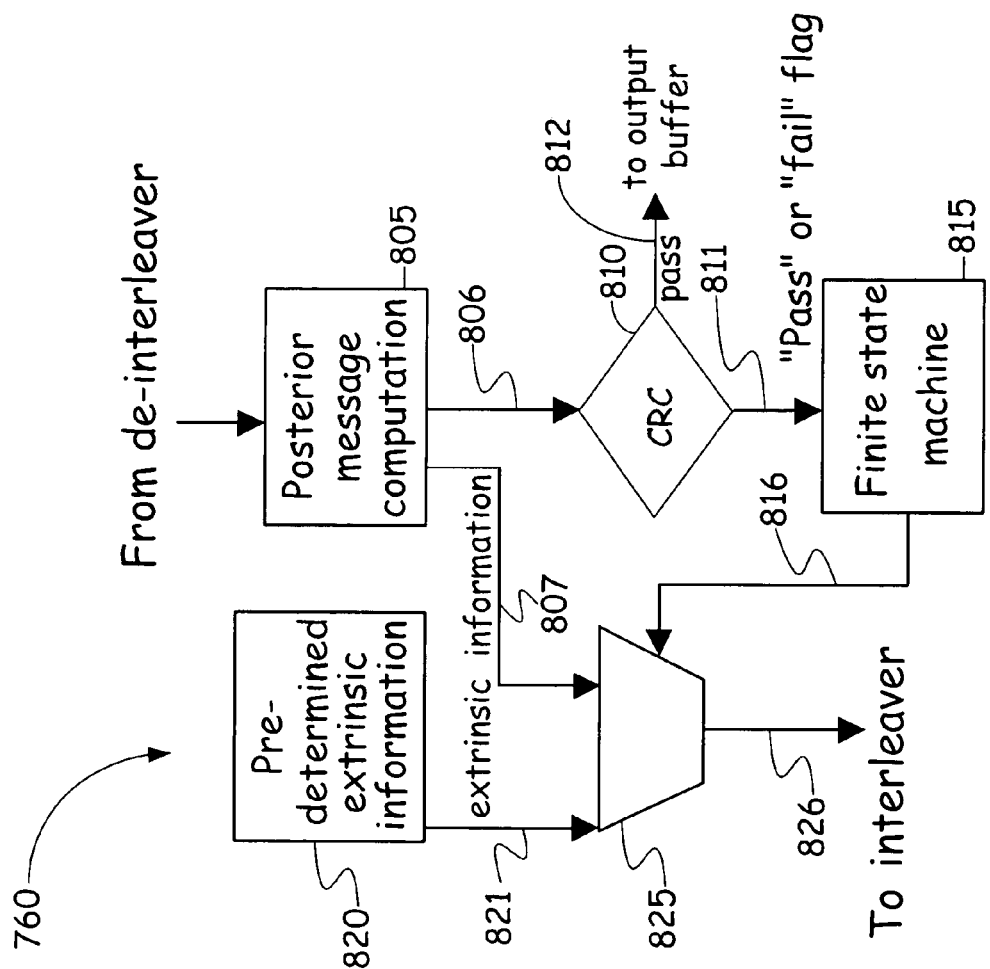
Figures 2, 8:
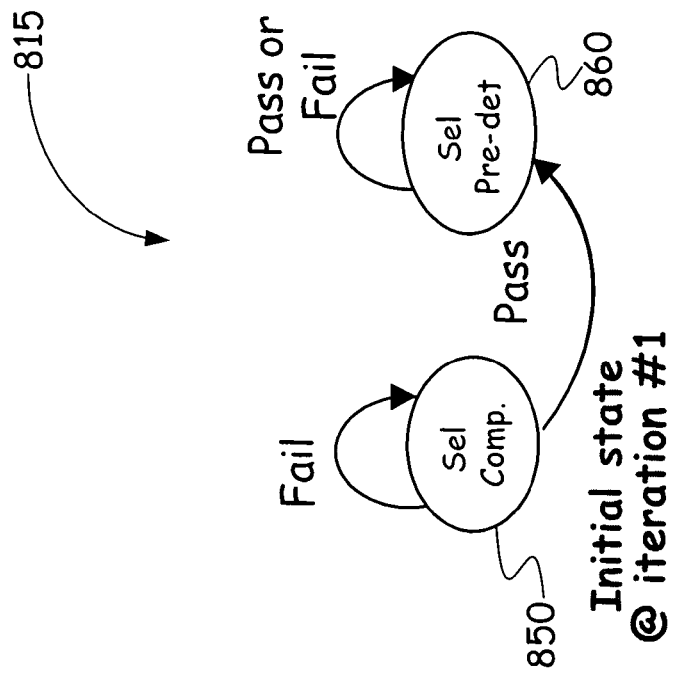

Referring now to FIG. 8-1, shown in block diagram form is an embodiment of one of decoding components 760 (for example decoding component 760-1) in accordance with an embodiment of the invention. As shown in FIG. 8-1, the de-interleaved data (from de-interleaver 445/745) is provided to a posterior message passing computation component 805. Component 805 performs the TPC decoding functions represented in block 450 of FIG. 4. The output or posterior message computation results 806 from component 805 are provided to CRC check 810 (implemented for example in CRC decoder 460 shown in FIG. 4), and the corresponding extrinsic information computation results 807 are provided to a first input of a multiplexer or switching device 825. A second input 821 to the multiplexer 825 is provided by a predetermined extrinsic information component 820. Predetermined extrinsic information component 820 provides at its output the extrinsic information representing the artificially high log-likelihood ratios for the code block being processed.

The results of the CRC check on the code block being processed are provided at 811 to finite state machine 815 which uses the results to generate a control parameter or signal 816 for controlling which of its two inputs multiplexer 825 provides at output 826 Output 826 of multiplexer 825 is coupled to interleaver 455/755 shown in FIGS. 4 and 7. If the results of a CRC check on the code block being processed are a "pass" (812), then this code block is passed to the output buffer 770 shown in FIG. 7.

The results of the CRC check on the code block being processed are provided at 811 to finite state machine 815 which uses the results to generate a control parameter or signal 816 for controlling which of its two inputs multiplexer 825 provides at output 826. Output 826 of multiplexer 825 is coupled to interleaver 455/755 shown in FIGS. 4 and 7. If the results of a CRC check on the code block being processed are a "pass", then this code block is passed to the output buffer 770 shown in FIG. 7.

Referring also to FIG. 8-2, shown is an implementation of finite state machine 815 in accordance with an embodiment of the invention. As shown, finite state machine 815 includes a first state 850 in which the CRC has failed and control parameter or signal 816 is generated to select the posterior message computation (provided at 806) from component 805. In other words, this state causes multiplexer 825 to pass the extrinsic information from component 805 to output 826. Once the CRC for the code block has passed, finite state machine enters a second state 860 in which control parameter or signal 816 is generated to select the predetermined extrinsic information (provided at 821) from component 820. In other words, this state causes multiplexer 825 to pass the predetermined extrinsic information having the artificially high log-likelihood ratios to output 826. Once the CRC has passed for the code block, finite state machine 815 stays in this second state 860 for all subsequent iterations, regardless of whether the CRC is repeated and of whether a repeated CRC passes or fails following these subsequent iterations. For those code blocks which have passed CRC once, they should never fail the subsequent CRC due to the artificially high log likelihood values assigned to all the bits in those code blocks.

It is to be understood that even though numerous characteristics and advantages of various embodiments of the invention have been set forth in the foregoing description, together with details of the structure and function of various embodiments of the invention, this disclosure is illustrative only, and changes may be made in detail, especially in matters of structure and arrangement of parts within the principles of the present invention to the full extent indicated by the broad general meaning of the terms in which the appended claims are expressed. For example, the particular elements may vary depending on the particular application for the decoding systems while maintaining substantially the same functionality without departing from the scope and spirit of the present invention. In addition, although the embodiment described herein is primarily described with reference to a data storage system, it will be appreciated by those skilled in the art that the teachings of the present invention can be applied to communication and other systems, without departing from the scope and spirit of the present invention.

What is claimed is:

1. A method, comprising:
   receiving an interleaved turbo product code (TPC) code word at a sequence detector;
   performing a soft decision algorithm to the interleaved TPC code word at the sequence detector;
   transmitting the interleaved TPC code word to a TPC decoder, the transmitting including de-interleaving the TPC code word;
   decoding the de-interleaved TPC code word at the TPC decoder into a plurality of code blocks;
   performing a cyclic redundancy check (CRC) on each of the plurality of code blocks of the TPC code word;
   assigning an artificially high probability confidence measure to bits of any of the plurality of code blocks which pass the CRC; and
   iteratively decoding the TPC code word between the soft decision algorithm of the sequence detector and the TPC decoder using the artificially high probability confidence measure assigned to bits of code blocks which pass the CRC, the TPC code word re-interleaved when transmitted to the sequence detector.

2. The method of claim 1, wherein performing the CRC on each of the plurality of code blocks further comprises performing the CRC on each of the plurality of code blocks during a first iteration between the soft decision algorithm and the TPC decoder.

3. The method of claim 2, wherein performing the CRC on each of the plurality of code blocks during the first iteration between the soft decision algorithm and the TPC decoder further comprises performing the CRC on each of the code blocks after decoding using the TPC decoder and before the corresponding probability confidence measures from the plurality of code blocks are sent back to the soft decision algorithm.

4. The method of claim 3, wherein performing the CRC on each of the plurality of code blocks further comprises performing the CRC on each of the plurality of code blocks during each of a plurality of iterations between the soft decision algorithm and the TPC decoder, and wherein assigning the artificially high probability confidence measure to bits of any of the plurality of code blocks which pass the CRC further comprises assigning the artificially high probability confidence measure to bits of each code block which passes the CRC during the iteration in which the code block passes the CRC.

5. The method of claim 1, wherein the probability confidence measures are log-likelihood ratios, and wherein assigning the artificially high probability confidence measure comprises assigning an artificially high log-likelihood ratio.

6. The method of claim 1, wherein the soft decision algorithm is a soft output viterbi algorithm (SOVA).

7. The method of claim 1, wherein the soft decision algorithm is a Bahl, Cocke, Jelinek, and Raviv (BCJR) algorithm.

8. The method of claim 1, wherein the TPC code word is a TPC code word with single parity check (TPC/SPC).

9. A communication system, comprising:
   iterative decoder implementing circuitry configured to:
   i) receive an interleaved turbo product code (TPC) code word at a sequence detector;
   ii) perform a soft decision algorithm to the interleaved TPC code word at the sequence detector;
   iii) transmit the interleaved TPC code word to a TPC decoder, the transmission adapted to de-interleave the TPC code word;
   iv) decode the de-interleaved TPC code word at the TPC decoder into a plurality of code blocks;
   v) perform a cyclic redundancy check (CRC) on each of the plurality of code blocks of the TPC code word;
   vi) assign an artificially high probability confidence measure to bits of any of the plurality of code blocks which pass the CRC; and
   vii) iteratively decode the TPC code word between the soft decision algorithm of the sequence detector and the TPC decoder using the artificially high probability confidence measure assigned to bits of code blocks which pass the CRC, the TPC code word re-interleaved when transmitted to the sequence detector.

10. An apparatus comprising:
an iterative decoder having a TPC decoder and a sequence detector implementing a soft decision algorithm, the iterative decoder configured to iteratively decode a turbo product code (TPC) code word between the sequence detector and TPC decoder, the TPC code word interleaved at the sequence detector and de-interleaved at the TPC decoder;
cyclic redundancy check (CRC) implementing circuitry configured to perform a CRC on each of a plurality of code blocks of the TPC code word; and
pre-determined extrinsic information generating circuitry configured to assign extrinsic information representing an artificially high probability confidence measure to bits of any of the plurality of code blocks which pass the CRC, the artificially high probability confidence measure used by the iterative decoder.

11. The apparatus of claim 10, wherein the cyclic redundancy check implementing circuitry forms part of the iterative decoder.

12. The apparatus of claim 10, wherein the soft decision algorithm is a soft output viterbi algorithm (SOVA).

13. The apparatus of claim 10, wherein the soft decision algorithm is a Bahl, Cocke, Jelinek, and Raviv (BCJR) algorithm.

14. The apparatus of claim 10, wherein the TPC decoder is configured to decode a TPC code word with single parity check (TPC/SPC).

15. The apparatus of claim 10, wherein the iterative decoder and the CRC implementing circuitry are configured to perform the CRC on each of the code blocks after decoding using the TPC decoder and before the corresponding extrinsic information from the plurality of code blocks are sent back to the soft decision algorithm.

16. The apparatus of claim 15, wherein the iterative decoder and the CRC implementing circuitry are configured to perform the CRC on each of the plurality of code blocks during each of a plurality of iterations between the soft decision algorithm and the TPC decoder, and wherein the predetermined extrinsic information generating circuitry is configured to assign the extrinsic information representing the artificially high probability confidence measure to bits of any of the plurality of code blocks which pass the CRC during the iteration in which the code block passes the CRC.

17. An iterative decoder, comprising:
a sequence detector adapted to receive an interleaved turbo product code (TPC) code word and to perform a soft decision algorithm to the interleaved TPC code word;
a de-interleaver adapted to de-interleave and transmit the TPC code word from the sequence detector;
a TPC decoder adapted to receive the de-inteleaved TPC code word and to decode the de-interleaved TPC code word into a plurality of code blocks;
cyclic redundancy check (CRC) circuitry adapted to perform a CRC on each of the plurality of code blocks of the TPC code word from the TPC decoder and to assign an artificially high probability confidence measure to bits of any of the plurality of code blocks which pass the CRC before returning the TPC code word to the TPC decoder; and
an interleaver adapted to interleave and transmit the TPC code word from the TPC decoder to the sequence detector, wherein the TPC code word is iteratively decoded between the soft decision algorithm of the sequence detector and the TPC decoder using the artificially high probability confidence measure assigned to bits of code blocks which pass the CRC.

18. A method, comprising:
performing a cyclic redundancy check (CRC) on each of a plurality of code blocks of a turbo product code (TPC) code word;
assigning an artificially high probability confidence measure to bits of any of the plurality of code blocks which pass the CRC; and
iteratively decoding the TPC code word between a soft decision algorithm of a sequence detector and a TPC decoder using the artificially high probability confidence measure assigned to bits of code blocks which pass the CRC, the TPC code word interleaved at the sequence detector and de-interleaved at the TPC decoder.

* * * * *